United States Patent
Hwang et al.

(10) Patent No.: US 6,239,479 B1
(45) Date of Patent: May 29, 2001

(54) THERMAL NEUTRON SHIELDED INTEGRATED CIRCUITS

(75) Inventors: Ming Hwang, Richardson; William R. McKee, Plano, both of TX (US); Robert Baumann, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/415,399

(22) Filed: Apr. 3, 1995

(51) Int. Cl.[7] .................................................. H01L 23/552
(52) U.S. Cl. ............................................. 257/659; 257/660
(58) Field of Search .................................. 257/787, 788, 257/789, 795, 659, 660, 294, 422, 435

(56) References Cited

U.S. PATENT DOCUMENTS

| | | | |
|---|---|---|---|
| 3,611,207 | * 10/1971 | Klahr | 257/461 |
| 4,415,526 | * 11/1983 | Garrett | 257/428 |
| 4,691,243 | * 9/1987 | Canella et al. | 257/435 |
| 5,391,924 | * 2/1995 | Uchida et al. | 257/788 |

FOREIGN PATENT DOCUMENTS

| | | | |
|---|---|---|---|
| 55-088358 | * 7/1980 | (JP) | 257/795 |
| 1028952 | * 1/1989 | (JP) | 257/659 |
| 5267504 | * 10/1993 | (JP) . | |

OTHER PUBLICATIONS

Enhanced Adhesion and Thermal Conductivity of Epoxy Sealant, IBM TDB vol. 28 No. 11 4/86 p. 4710.*

* cited by examiner

*Primary Examiner*—Roy Potter
(74) *Attorney, Agent, or Firm*—Carlton H. Hoel; W. James Brady; Frederick J. Telecky, Jr.

(57) ABSTRACT

A thermal neutron shield (520) for integrated circuits (511–515) deters absorption of thermal neutrons by circuit constituents to form unstable isotopes with subsequent decay which generates bursts of charge which may upset of stored charge and create soft errors. The shielding may be either at the integrated circuit level (such as a layer on insulation or in the filler of plastic packaging material) or at the board level (such as a filler or film on a container wall).

6 Claims, 3 Drawing Sheets

THERMAL NEUTRON SHIELDED INTEGRATED CIRCUITS

CROSS-REFERENCE TO RELATED APPLICATIONS

Coassigned U.S. patent application Ser. No. 08/017,543, filed Feb. 16, 1993 discloses related subject matter.

BACKGROUND OF THE INVENTION

The invention relates to semiconductor devices and circuits, and, more particularly, to both semiconductor device packaging and system level containers.

Many digital semiconductor devices, such as DRAMs, SRAMs, A/D converters, and so forth rely on electrical charge on a capacitive node for storage of a digital signal, and thus such devices are sensitive to events which transport unintended charge to the node. For example, silicon devices in airplanes encounter cosmic rays which include high energy (1–10 Mev) neutrons; FIG. 1 shows the high energy neutron flux as a function of altitude. Such high energy neutrons may react with silicon nuclei in an integrated circuit substrate to yield heavy recoil nuclei which generate bursts of electrical charge that can migrate to a node in the substrate and upset a stored charge. Gossett et al, Single Event Phenomena in Atmospheric Neutron Environments, 40 IEEE Tr.Nuc.Sci. 1845 (1993), analyze upset in a bipolar SRAM.

At sea level cosmic rays include some high energy neutrons, but generally neutrons moving through the atmosphere thermalize (primarily scatter from nitrogen and oxygen nuclei) and their energies tend towards kT (0.025 eV at room tempeature). FIG. 2 heuristically illustrates the sea level neutron flux as a function of energy. See Hess et al, Cosmic-Ray Neutron Energy Spectrum, 116 Phys.Rev. 445 (1959); Ziegler et al, The Effect of Sea Level Cosmic Rays on Electronic Devices, 52 J.Appl.Phys. 4305 (1981); and Nakamura et al, Altitude Variation of Cosmic-Ray Neutrons, 53 Health Phys. 509 (1987). As the neutrons with energies well above kT pass through matter, they continue thermalizing and thus the source of thermal neutrons may be considered continuous.

One approach to compensate for such cosmic ray hazards simply increases node capacitances to require a large unintended charge for upset. However, this increases the substrate area used by a circuit and thus increases costs.

Semiconductor device packages typically fall into one of two types: plastic encapsulation and ceramic packages. Plastic encapsulation surrounds a semiconductor die plus its bond wires and lead frame with a roughly 2 mm thick plastic coating made of typically 27% novalac epoxy, 70% inert filler, 2% flame retardant, 1% colorant, plus accelerator, curing agent, and mold-release agent. The filler may be powdered quartz. However, quartz typically has natural uranium and thorium impurities. U and Th radioactive decay gives rise to alpha particles which generate bursts of electrical charges analogous to silicon nucleus recoil products arising from high energy neutron reaction. These likewise can migrate and upset stored signal charge on a node. Early approaches to controlling such alpha particle generated upsets placed an alpha particle absorbing barrier, such as a 30 μm thick silicone rubber layer, between the die and the surrounding plastic. An alpha particle loses energy as it passes through matter, and typical ranges are 5–100 μm for 1–10 MeV alphas in various density materials with higher density yielding shorter ranges. Thus the 30 μm of silicone rubber barrier would dissipate most of a typical alpha particle energy prior to the alpha entering the active device areas of an integrated circuit.

Subsequently, fillers using quartz with low impurity levels brought the radiation down to less than 0.001 alpha/cm$^2$/hour and thus effectively eliminated the problem and the need for the barrier.

Ceramic packages typically have a body of 90% alumina plus 10% glass with lids of gold-plated kovar, a glass sealer, and air within the package cavity. All of these components may have alpha-emitting radioactive impurities, for example radon in cavity air. These components, particularly the aluminum and gold, may be purified to limit radioactive isotope levels and avoid excessive alpha generated upsets.

SUMMARY OF THE INVENTION

The present invention provides a thermal neutron absorbing layer both within integrated circuit packaging at the die level and also at the circuit board container level. Preferred embodiment thermal neutron absorbing layers include compounds of isotopes with anomolously large absorption cross sections such as of $^{157}$Gd, $^{149}$Sm, $^{113}$Cd, and $^{10}$B.

This thermal neutron absorbing layer has the advantage of decreasing upset sensitivity in devices caused by cosmic ray generated thermal neutrons which may react with the materials making up a device and generate secondary radiation that leads to upsets. The thermal neutron absorbing layer may be used in addition increased node capacitance sensitivity suppressors or alone. And use of an absorbing layer at the circuit board container level permits use of integrated circuit packages without any special precautions.

BRIEF DESCRIPTION OF THE DRAWINGS

The drawings are schematic for clarity.

DESCRIPTION OF THE PREFERRED EMBODIMENTS

Preferred Embodiment Package Material

Figure 1:
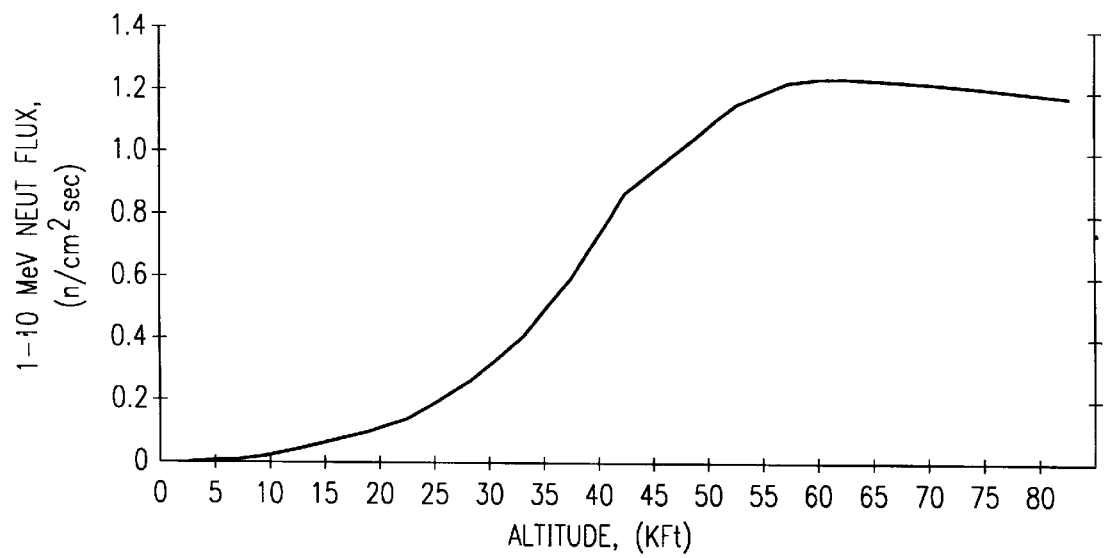
FIGS. 1–2 show cosmic neutron flux.
Figure 2:
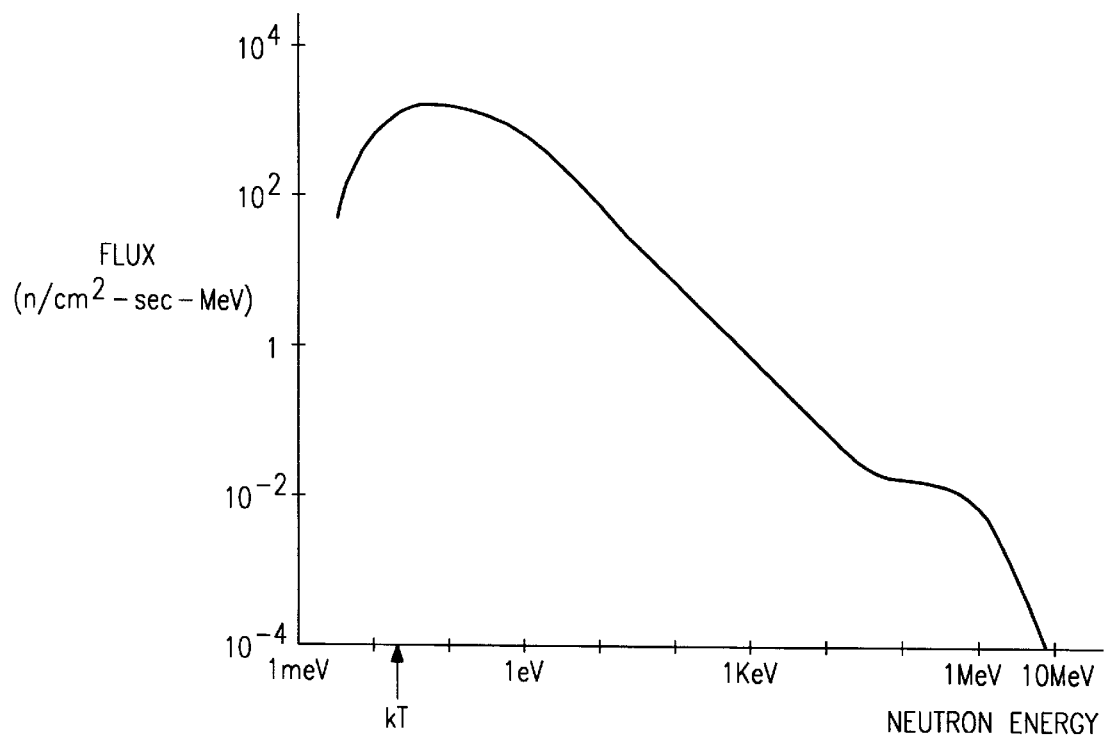

FIG. 2 illustrates the cosmic ray generated flux of thermal neutrons at sea level as on the order of 0.02 n/cm$^2$-sec with a predominance of low energy neutrons. Thermal neutrons may be easily absorbed by most nuclei of familiar materials, and the absorption cross sections typically compare to the nuclear size: very roughly on the order of $10^{-24}$ cm$^2$. Thus solid material of thickness 100 cm will absorb roughly 90% of incident thermal neutrons. But higher energy neutrons also impinging on the same material will initially have lower absorption rates and thermalize to create further thermal neutrons. Nevertheless, most thermal neutrons should pass through a thin structure such as an integrated circuit without interacting.

However, certain isotopes have anomolously high thermal neutron absorption cross sections, for example:

| Isotope | Absorption cross section ($\times 10^{-24}$/cm$^2$) |
| --- | --- |
| $^{157}$Gd | 260,000 |
| $^{149}$Sm | 42,000 |
| $^{113}$Cd | 20,000 |
| $^{10}$B | 3,800 |

This high absorption cross section by $^{10}$B implies even relatively thin layers of common semiconductor materials using boron, such as borophosphosilicate glass (BPSG) which finds use as an insulator, will absorb a significant portion of incident thermal neutrons. And the absorption of a thermal neutron yields an excited $^{11}B$ nucleus which decays:

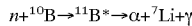

The alpha particle has an energy of about 1.47 MeV, the Li nucleus an energy of about 0.84 MeV, and the gamma ray an energy of about 0.478 MeV. Each of these decay products can create a burst of charge which cause an upset. Indeed, a 1.47 MeV alpha particle has a range of roughly 10–20 $\mu$m in material such as silicon and silicon dioxide, so emanation from within the integrated circuit die implies significant electric charge creation. Similarly, the $^7$Li has a range of a few $\mu$m . Note that the efficiency of charge generation increases as the alpha or $^7$Li slows down, so the full range must be away from sensitive nodes to avoid upsets. The $^{10}$B could be a constituent of electrical insulation layers such as borophosphosilicate glass (BPSG) which form a portion of devices on a silicon die.

Figure 3:
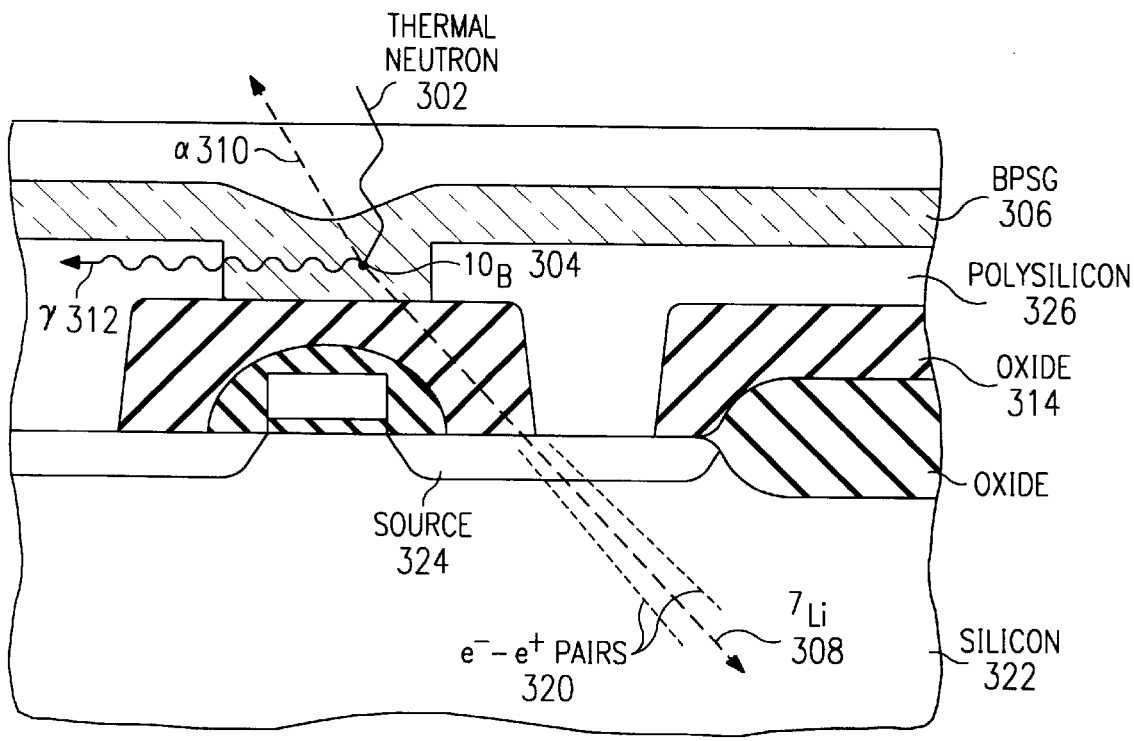
FIG. 3 illustrates a thermal neutron interaction.

FIG. 3 heuristically illustrates in cross sectional elevation view of such a thermal neutron absorption plus secondary emission leading to an upset from a $^{10}$B in an insulation layer. In particular, thermal neutron 302 is absorbed by $^{10}$B 304 which is part of BPSG layer 306, and the resultant $^{11}$B decays into $^7$Li 308, alpha 310, and gamma 312. The $^7$Li penetrates oxide layer (thickness roughly 0.3 $\mu$m ) and creates electron-hole pairs 320 in silicon substrate 322. The electrons generated can migrate to source 324 and add to the charge (possibly 1) already stored on polysilicon capacitor plate 326 and thereby change a 1 to a 0.

Similarly, absorption of thermal neutrons by other nuclei could lead to radiation and electric charge generation to upset signal charge at a node. In fact, the following elements commonly found in plastic packaged integrated circuits have sizable thermal neutron cross sections: H (0.33), N (1.8), Al (0.23), Si (0.17), P (0.16), Cr (3.1), Fe (2.56), As (4.3), W (18.), and Au (98.7) with the cross section as a multiple of $10^{-24}$ cm$^2$ in parenthesis. The H and N would be found in the plastic encapsulation, the Al and W found in interconnections, the Au in bond wires, the Cr and Fe in lead frames, the P in BPSG, PSG, and doped source/drains, the As in doped source/drains, and the Si in the plastic filler, the insulations such as BPSG, PSG, and undoped glasses, in polysilicon lines and capacitor plates, and in the substrate.

Figure 4:
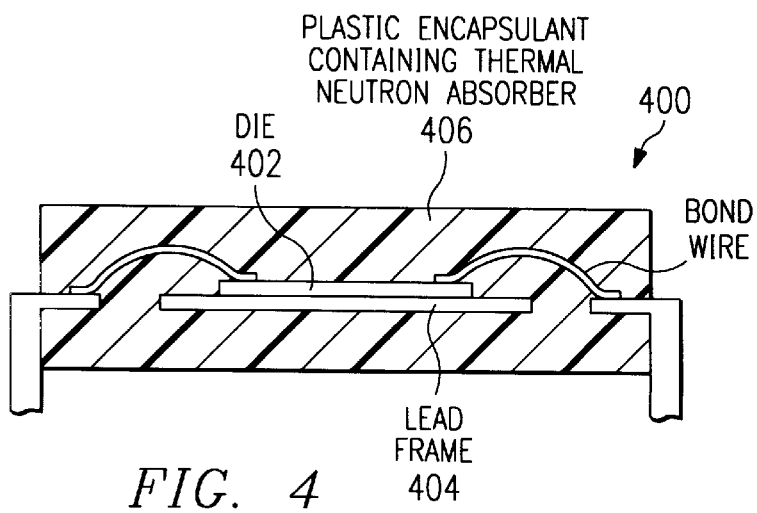
FIGS. 4–6 show three preferred embodiments approaches to reduction of incident thermal neutron flux.

FIG. 4 shows in cutaway perspective view a first preferred embodiment plastic packaged integrated circuit 400 with semiconductor die 402 on lead frame 404 and within plastic encapsulant 406 which includes $^{157}$Gd as part of the filler. Indeed, thermal neutrons must travel roughly 1 mm through plastic 406 to reach either die 402 or lead frame 404. Thus the flux of thermal neutrons reaching die 402 or lead frame 404 can be reduced by a factor of 100 if plastic 406 contains approximately 0.6% $^{157}$Gd.

Similarly, alternative thermal neutron absorbers could be used with a corresponding fraction of the plastic 406. For example, about 5% $^{113}$Cd will also yield the factor of 100 reduction. Further, less thermal neutron absorber will decrease the reduction factor, and more absorber will increase the reduction factor; so the absorber quantity can be adjusted to the situation. The reduction varies exponentially with the product of the cross section, the density of absorber nuclei, and the thickness. Hence, even $^{10}$B could be used in plastic 406 despite the adverse reaction products (alpha plus Li) provided the density of $^{10}$B is high enough to absorb sufficiently (e.g., 99%) all of the incident thermal neutrons at a distance away from die 402 which exceeds the penetration range of the alpha and Li. Thus an alpha penetration range of only 10–20 $\mu$m would be a negligible portion of plastic 406, and 1 mm of plastic with roughly 40% $^{10}$B or 2 mm of 20% $^{10}$B would absorb 99% of the incident thermal neutrons. Of course, 1 mm of 20% $^{10}$B would absorb 90% of the incident thermal neutrons, and a 90% absorption may suffice for the particular circuitry being shielded.

An analogous addition of thermal neutron absorbers to ceramic package material (primarily alumina) will provide corresponding protection for a die within a ceramic package. Both the ceramic package body and the lid would include thermal neutrn absorbers.

Further, an analogous addition of thermal neutron absorbers to printed wiring boards and attachment epoxies will provide thermal neutron shielding for bare die which are epoxied directly to printed wiring boards.

Preferred Embodiment Container

Figure 5:
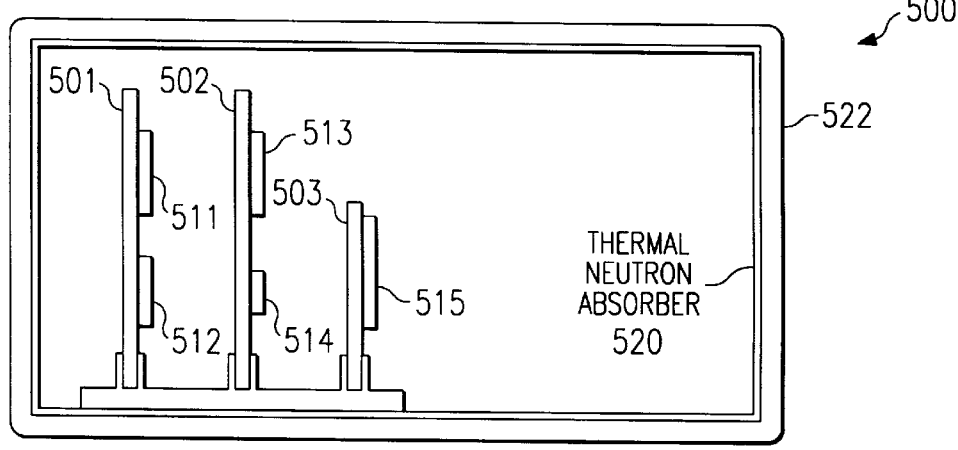

FIG. 5 illustrates a preferred embodiment container 500 surrounding printed wiring boards 501–503 containing packaged integrated circuits 511–515. Container includes thermal neutron absorbing layer 520 inside of container walls 522. Absorbing layer 520 could simply be the same material as plastic 406 in the previous preferred embodiment. Indeed, a 3 mm thick layer 520 of 13% $^{10}$B could be used to stop 99% of incident thermal neutrons from reaching any of integrated circuits 511–515. Further, the secondary alpha and $^7$Li emitted after absorption have insufficient energy to penetrate the (plastic or ceramic) packaging of integrated circuits 511–515. Thus absorbing layer 520 provides about the same protection as plastic 406, but absorbing layer 520 permits greater flexibility in that no processing changes need be made in the fabrication of integrated circuits 511–515.

The thermal neutron absorbers could be formed as part of the material comprising container walls 522 or as a separate attached layer (or layers) 520. A preformed separate absorber layer 520 could be attached with adhesive, or the separate absorber layer 520 could be formed by deposition onto walls 522. And the absorber layer(s) could be on the inside the outside or both sides of container walls 522.

Thermal neutron absorbers in container walls may be useful even at low levels in which the incident thermal neutrons are only reduced by a factor of 2; however, reduction by a factor of 10 or more is not difficult to achieve. Further, openings in the container walls will diminish the reduction factor, but may be acceptable.

Preferred Embodiment Absorbing Die Layer

Figure 6:
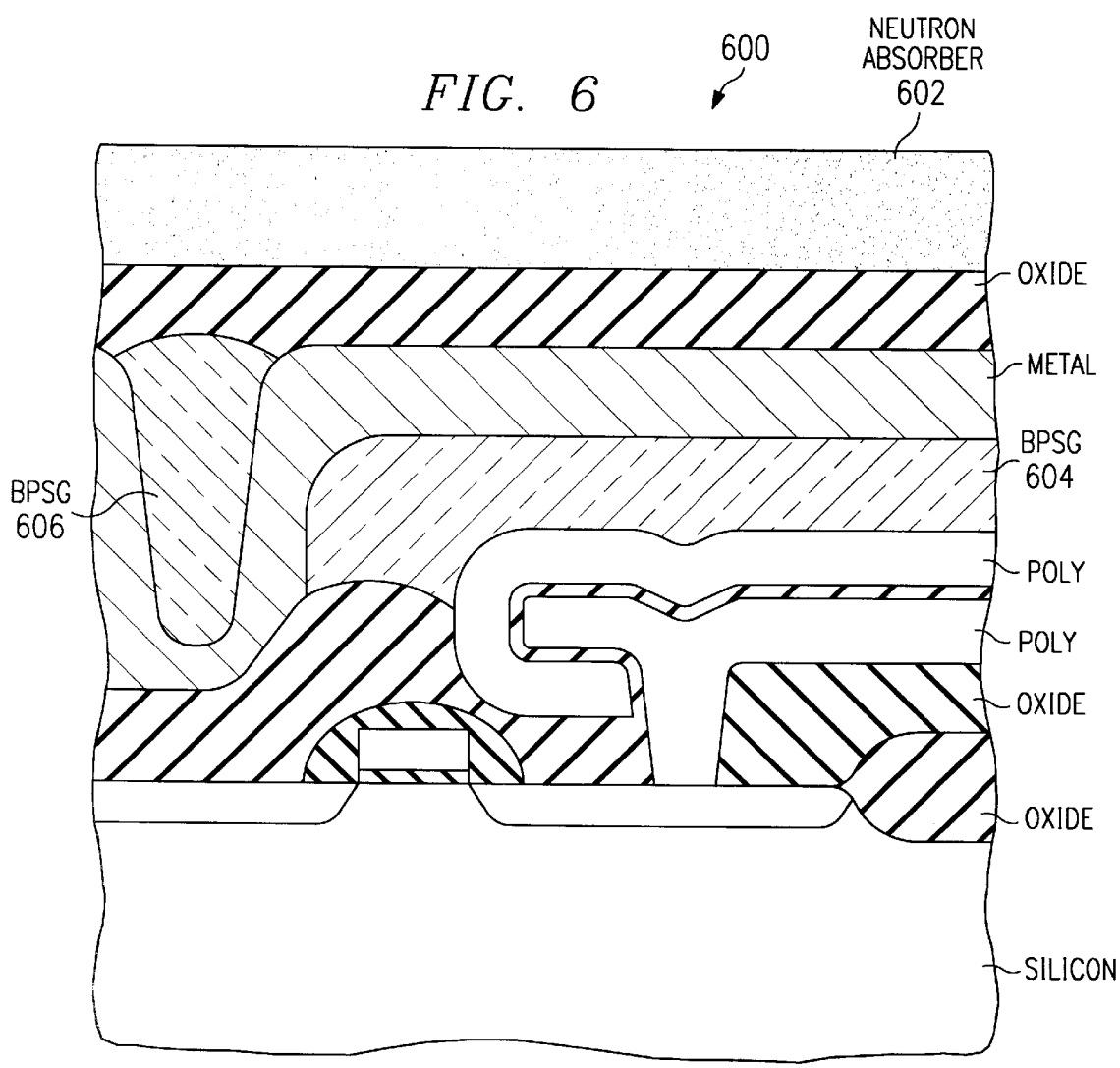

FIG. 6 illustrates a preferred embodiment integrated circuit 600 with layer 602 of thermal neutron absorbing material in a coating over underlying BPSG 604–606. Layer 602 absorbs thermal neutrons in a thin layer (a few gm at most so as not to disrupt the fabrication process) and thus preferably has a high $^{157}$Gd content and reduces the neutron flux to BPSG 604–606 by a factor of about 2 or more, or even higher factors such as 10. Indeed, higher reduction factors may be obtained by higher Gd content and thicker layers, but such may be difficult to incorporate into the fabrication process.

Of course, both layer 602 and thermal neutron absorbers in the integrated circuit packaging may be used together.

Modifications and Advantages

The preferred embodiments may be varied in many ways while retaining one or more of the features of thermal neutron absorbers to shield integrated circuit devices.

For example, the layer thicknesses and percentages of thermal neutron absorber could be varied for convenience in construction or to absorb a larger or smaller percentage of incident neutrons. Further, combinations of absorbers may be used, either as separate stacked layers or mixed within the same layer.

What is claimed is:

1. An integrated circuit, comprising:
   (a) a substrate containing devices at a surface;
   (b) a layer containing thermal neutron absorbers over said surface, said layer not packaging material, wherein said thermal neutron absorbers reduce incident thermal neutrons by a factor of about 2 or more.
2. The integrated circuit of claim 1, wherein:
   (a) said thermal neutron absorbers are selected from the group consisting of $^{157}$Gd, $^{149}$Sm, $^{113}$Cd, $^{10}$B, and combinations thereof.
3. The integrated circuit of claim 2, further comprising:
   (a) package material adjacent said integrated circuit, wherein said package material includes thermal neutron absorbers.
4. An integrated circuit container, comprising:
   (a) container walls which include thermal neutron absorbers that reduce the incident thermal neutrons to integrated circuits in said container and spaced from said walls by a factor of about 2 or more.
5. The integrated circuit container of claim 4, wherein:
   (a) said thermal neutron absorbers are selected from the group consisting of $^{157}$Gd, $^{149}$Sm, $^{113}$Cd, $^{10}$B, and combinations thereof.
6. The integrated circuit container of claim 4, wherein:
   (a) said thermal neutron absorbers are in a layer attached to a wall.

* * * * *